US009087617B2

(12) United States Patent
Gonya et al.

(10) Patent No.: US 9,087,617 B2
(45) Date of Patent: *Jul. 21, 2015

(54) X-RAY OBSCURATION FILM AND RELATED TECHNIQUES

(71) Applicant: Lockheed Martin Corporation, Bethesda, MD (US)

(72) Inventors: Stephen Gonya, Endicott, NY (US); Jesse Iannon, Binghamton, NY (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/325,670

(22) Filed: Jul. 8, 2014

(65) Prior Publication Data
US 2014/0374627 A1 Dec. 25, 2014

Related U.S. Application Data

(63) Continuation of application No. 13/827,297, filed on Mar. 14, 2013, now Pat. No. 8,772,745.

(51) Int. Cl.
G21F 1/12 (2006.01)
G21F 3/00 (2006.01)
H05K 1/02 (2006.01)
H01L 23/00 (2006.01)

(52) U.S. Cl.
CPC ............... *G21F 3/00* (2013.01); *H01L 23/573* (2013.01); *H05K 1/02* (2013.01); *H01L 2924/0002* (2013.01); *H05K 1/0209* (2013.01); *H05K 2201/0715* (2013.01); *H05K 2201/09681* (2013.01)

(58) Field of Classification Search
CPC ............................ H01L 23/552; H05K 1/0275
USPC ...................... 250/505.1, 515.1, 517.1; 427/7
See application file for complete search history.

(56) References Cited

U.S. PATENT DOCUMENTS 5,286,417 A 2/1994 Mahmoud et al.
5,368,883 A 11/1994 Beaver
(Continued)

FOREIGN PATENT DOCUMENTS

EP 1020874 A1 7/2000
EP 1840964 A1 10/2007
(Continued)

*Primary Examiner* — Michael Maskell
(74) *Attorney, Agent, or Firm* — Miles & Stockbridge PC; James T. Carmichael

(57) ABSTRACT

An X-ray obscuration (XRO) film comprising one or more metallic wire mesh layers and an adjacent layer of indium foil having portions which extend into openings of the wire mesh and in contact with metallic portions thereof. The XRO film can be capable of absorbing at least a portion of X-ray energy thereby creating an interference pattern when the XRO film is coupled with an electronic circuit and placed between an X-ray source and an X-ray detector and subjected to radiographic inspection. The interference pattern can create sufficient visual static to effectively obscure circuit lines in the electronic circuit when subjected to radiographic inspection techniques. The XRO film can be substantially thinner than existing solutions for preventing X-ray inspection with an exemplary embodiment being no more than 5 mils thick. The metallic XRO film can also provide electromagnetic shielding and/or heat dissipation for electronic circuits.

20 Claims, 10 Drawing Sheets

(56) References Cited

U.S. PATENT DOCUMENTS

| | | |
|---|---|---|
| 5,608,434 A | 3/1997 | Wilson et al. |
| 5,738,797 A | 4/1998 | Belke, Jr. et al. |
| 5,938,455 A | 8/1999 | Glovatsky et al. |
| 6,188,582 B1 | 2/2001 | Peter |
| 6,198,630 B1 | 3/2001 | Cromwell |
| 6,386,890 B1 | 5/2002 | Bhatt et al. |
| 6,593,900 B1 | 7/2003 | Craven |
| 7,188,282 B2 | 3/2007 | Walmsley |
| 7,302,592 B2 | 11/2007 | Shipton et al. |
| 7,815,475 B2 | 10/2010 | Peloza et al. |
| 8,772,745 B1 * | 7/2014 | Gonya et al. ............... 250/515.1 |
| 2004/0199786 A1 | 10/2004 | Walmsley |
| 2004/0227205 A1 | 11/2004 | Walmsley |
| 2008/0244898 A1 | 10/2008 | Shacklette et al. |
| 2010/0031064 A1 | 2/2010 | Walmsley |
| 2010/0255312 A1 | 10/2010 | Dougherty et al. |
| 2011/0031982 A1 | 2/2011 | Leon et al. |
| 2011/0090658 A1 * | 4/2011 | Adams et al. ................. 361/765 |
| 2011/0227603 A1 | 9/2011 | Leon et al. |
| 2012/0185636 A1 | 7/2012 | Leon et al. |

FOREIGN PATENT DOCUMENTS

| | | |
|---|---|---|
| WO | WO-2010/057145 A1 | 5/2010 |
| WO | WO-2011/046769 A1 | 4/2011 |
| WO | WO-2012/123400 A1 | 9/2012 |

* cited by examiner

X-RAY OBSCURATION FILM AND RELATED TECHNIQUES

Embodiments relate generally to X-ray obscuration film, to methods of manufacturing and use of the same, and, more particularly, to methods of using X-ray obscuration film to obscure circuit lines in an electronic circuit or other electronic device when subjected to radiographic inspection techniques, such as X-ray inspection.

The design of an electronic device, such as an electronic circuit, a wiring circuit, printed wiring board, antenna pattern, or electronic hybrid, can be discovered using radiographic inspection techniques, such as X-ray inspection. A layer of dense material such as lead, tungsten, or gold can be placed between the X-ray source and X-ray detector to attempt to prevent X-ray inspection of an electronic circuit/device, but thick layers of these materials may be required to absorb the X-ray energy applied during inspection to sufficiently obscure the X-ray density contrast of the circuit lines. The thickness of these materials necessary to prevent radiographic inspection of electronic circuits/devices may prohibit their use when such a thick/heavy layer of such material is not desired and/or feasible. Additionally, even a thick and heavy layer of one of these materials may not be able to prevent inspection because those performing the inspection may be able to increase the power of X-ray energy being applied and detect a contrast between the thick layer of absorbing material and the circuit lines. The thick absorbing layer will attenuate the X-ray density contrast of the circuit lines but does not eliminate the contrast until most of the X-ray energy is absorbed by the layer. A need may exist to prevent radiographic inspection of electronic circuits/devices using a thin, light, formable, and/or moldable X-ray obscuration film that can be coupled to existing electric circuits and/or devices and/or integrated into an electronic circuit device as a layer thereof.

One embodiment includes an obscured electronic device that can obscure circuit lines in an electronic circuit when it is subjected to radiographic inspection techniques. The obscured electronic device can comprise an electronic circuit including a plurality of circuit lines and an obscuration film coupled to the electronic circuit. The obscuration film can comprise a first copper wire mesh, a second copper wire mesh, and a layer of indium having portions which extend into openings of the first and second copper wire meshes and in contact with copper portions thereof. The obscuration film can be capable of absorbing at least a portion of electromagnetic radiation energy which creates an interference pattern obscuring the plurality of circuit lines of the electronic circuit when the device is placed between an electromagnetic radiation source and an electromagnetic radiation detector.

Another embodiment can include an X-ray obscuration film comprising a metallic alloy wire mesh and an adjacent layer of indium having portions which extend into openings of the metallic alloy wire mesh and in contact with metallic alloy portions thereof. The X-ray obscuration film can be capable of absorbing at least a portion of X-ray energy which creates an interference pattern when said X-ray obscuration film is coupled with an electronic circuit placed between an X-ray source and an X-ray detector. The interference pattern can obscure lines in the electronic circuit when subjected to radiographic inspection techniques.

Another embodiment can include a method of manufacturing an X-ray obscuration film. The method can include overlaying two or more metallic alloy wire mesh layers in an orientation and solid-state bonding the alloy wire mesh layers together using a foil sheet under high pressure to create the X-ray obscuration film. The metallic alloy wire mesh layers can be configured in the orientation to absorb at least a portion of X-ray energy creating an interference pattern when the X-ray obscuration film is coupled to an electronic circuit and placed between an X-ray source and an X-ray detector. The interference pattern can obscure circuit lines in the electronic circuit. In some embodiments, the solid-state bonding can include solid-state bonding the alloy wire mesh layers together using a foil sheet under high pressure to extrude a portion of the material of the foil sheet into openings of the two or more metallic alloy wire mesh layers. In some embodiments, the X-ray obscuration film can be molded or formed to a complex surface contour for its final configuration.

DETAILED DESCRIPTION

Figure 1:
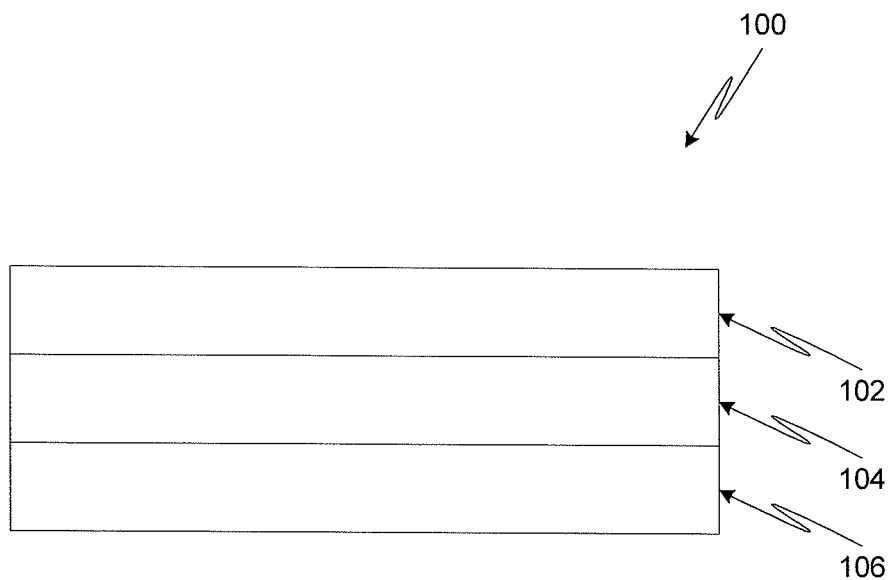
FIG. 1 is a cross-sectional view of an exemplary embodiment of an X-ray obscuration film.

FIG. 1 is a cross-sectional view of an exemplary embodiment of an X-ray obscuration film. X-ray obscuration film 100 can include a first metallic alloy wire mesh 102, a foil sheet 104, and a second metallic alloy wire mesh 106. The first metallic alloy wire mesh 102 and second metallic alloy wire mesh 106 can each comprise a copper wire mesh, such as, for example, a Cu-100 mesh, a Cu-145 mesh, or a CuP-325 mesh. The foil sheet 104 can comprise an indium and/or lead-indium alloy foil sheet, such as, for example, a 2 mil indium foil sheet.

Figure 7:
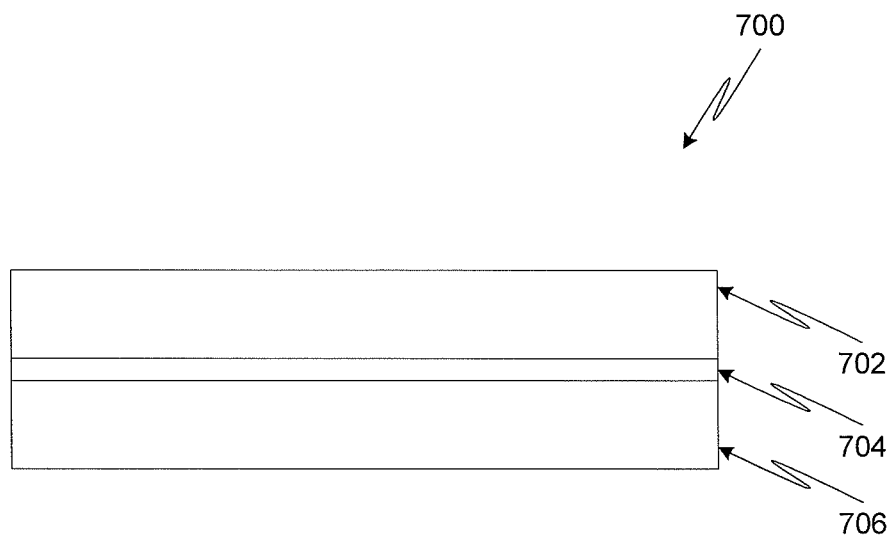
FIG. 7 is a cross-sectional view of an exemplary embodiment of an obscured electronic device including an electronic circuit with an X-ray obscuration film coupled thereto.

In some embodiments, the X-ray obscuration film 100 can be coupled to an electronic circuit or electronic device, such as, for example, a wiring circuit, a printed wiring board, an antenna pattern, or an electronic hybrid, as shown in FIG. 7. The first metallic alloy wire mesh 102, foil sheet 104, and second metallic allow wire mesh 106 can be configured such that, for example, when subjected to X-ray inspection, each absorbs at least a portion of X-ray energy and the X-ray obscuration film 100 creates an interference pattern, such as, for example, a moiré-like interference pattern, which creates visual static that obscures the circuit lines of the electronic circuit during radiographic inspection, an example of which is shown in FIG. 2.

In addition to obscuring lines in an electronic circuit/device subjected to radiographic inspection techniques, in some embodiments, the X-ray obscuration film 100 can also, when coupled to an electronic circuit/device, provide electromagnetic shielding and/or heat dissipation for the electronic circuit/device.

In various embodiments, the X-ray obscuration film 100 can be substantially thinner than some other solutions for preventing X-ray inspection of circuits. In preferred embodiments, the film is less than 10 mils thick, and most preferably no more than 5 mils thick. For example, an X-ray obscuration file comprising a Cu-100 mesh (first metallic alloy wire mesh 102), a Cu-145 mesh (second metallic alloy wire mesh 106), and a 2 mil indium foil sheet (foil sheet 104), can be approximately 5 mils thick.

Figure 2:
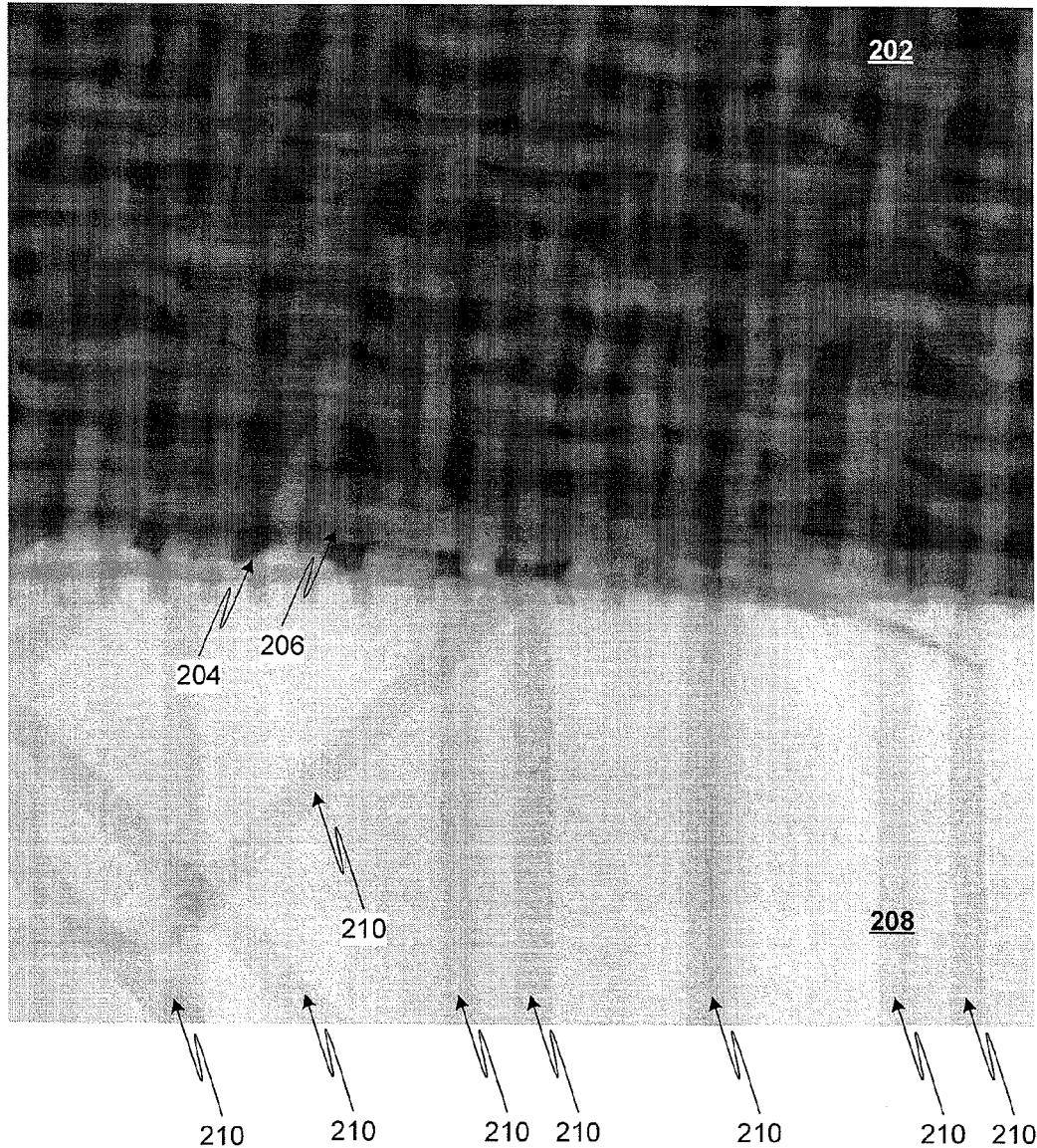
FIG. 2 is an X-ray image showing obscuration of lines in an electronic circuit using an exemplary embodiment of an X-ray obscuration film.

FIG. 2 is an X-ray image 200 showing obscuration of circuit lines 210 in an electronic circuit 208 using an exemplary embodiment of an X-ray obscuration film 202. X-ray image 200 shows an electronic circuit 208 with a plurality of circuit lines 210 obscured by an X-ray obscuration film 202. X-ray obscuration film 202 includes a copper wire mesh layer 204, an indium foil layer 304, and a copper wire mesh layer 206, and provides for obscuration of circuit lines 210 as described herein.

Figure 3:
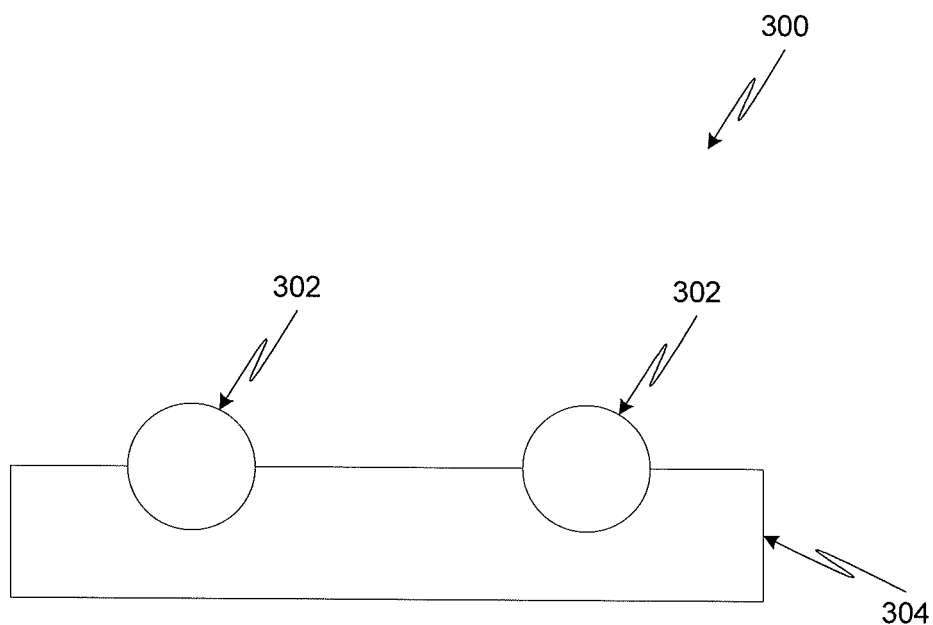
FIG. 3 is a cross-sectional view of an exemplary embodiment of an X-ray obscuration film.

FIG. 3 is a cross-sectional view of an exemplary embodiment of an X-ray obscuration film. X-ray obscuration film 300 can include a copper wire mesh 302 and an adjacent layer of indium 304 having portions which extend into openings of the copper wire mesh 302 and in contact with copper portions thereof.

In some embodiments, the copper wire mesh 302 can comprise, for example, a Cu-100 mesh, a Cu-145 mesh, or a CuP-325 mesh. The indium layer 304 can comprise an indium and/or lead-indium alloy foil sheet, such as, for example, a 2 mil indium foil sheet.

Figure 5:
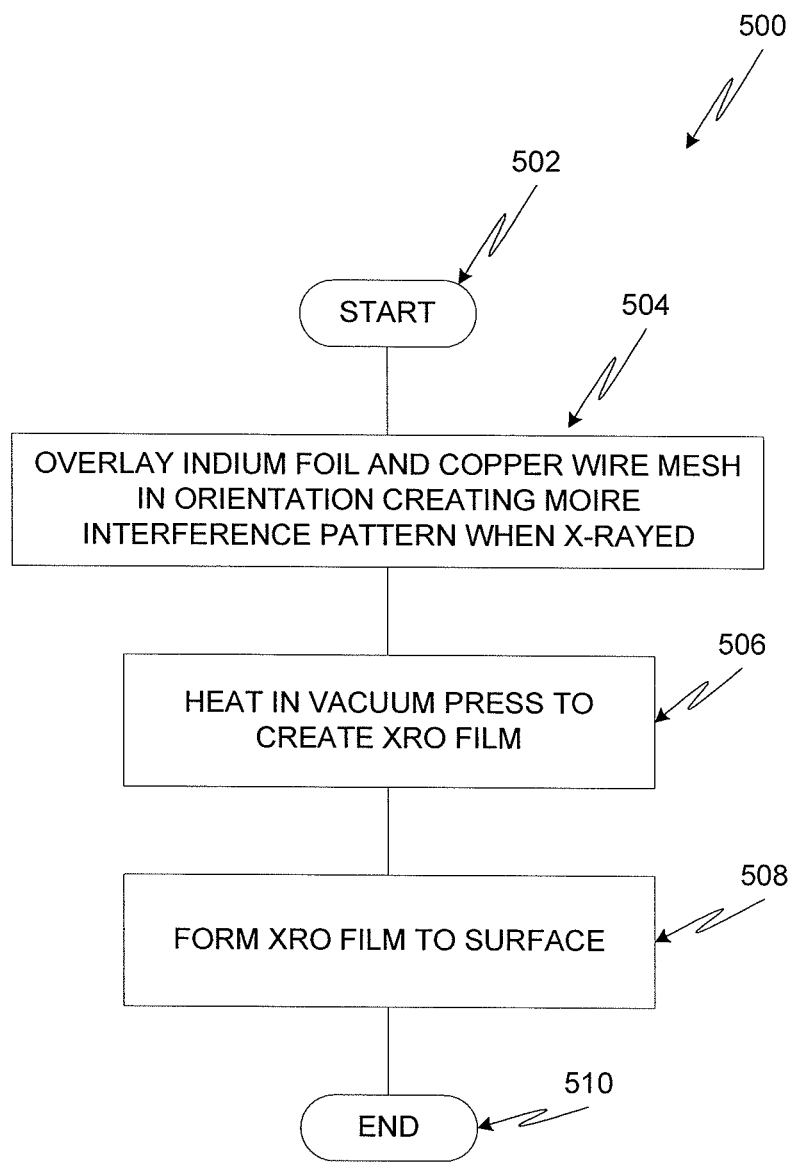
FIG. 5 is a flowchart showing an exemplary method for manufacturing an exemplary embodiment of an X-ray obscuration film.

In some embodiments, the copper wire mesh 302 and indium layer 304 can be cold welded or solid-state bonded together, for example, as described in FIG. 5.

Figure 4:
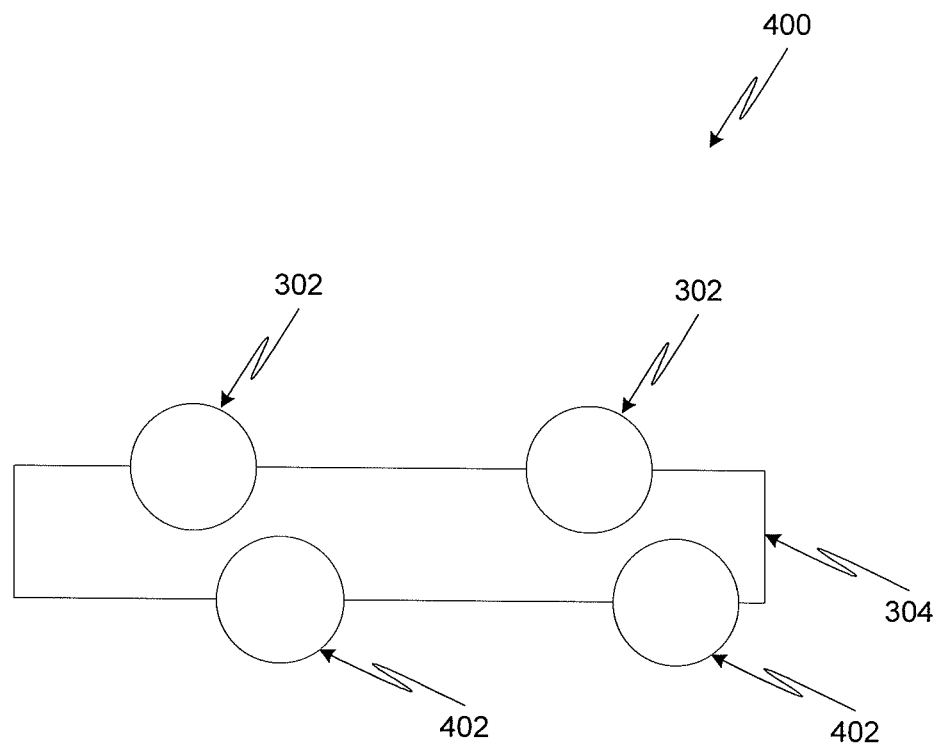
FIG. 4 is a cross-sectional view of an exemplary embodiment of an X-ray obscuration film.

FIG. 4 is a cross-sectional view of an exemplary embodiment of an X-ray obscuration film 400. X-ray obscuration film 400 can include a copper wire mesh 302, copper wire mesh 402, and an adjacent layer of indium 304 having portions which extend into openings of copper wire meshes 302 and 402 and in contact with copper portions thereof.

In some embodiments, copper wire mesh 302 and copper wire mesh 402 can comprise, for example, a Cu-100 mesh, a Cu-145 mesh, or a CuP-325 mesh. The indium layer 304 can comprise an indium and/or lead-indium alloy foil sheet, such as, for example, a 2 mil indium foil sheet.

In such embodiments, the X-ray obscuration film 400 can be substantially thinner than existing solutions for preventing X-ray inspection of circuits, and when comprised, for example, of a Cu-100 mesh (copper wire mesh 302), a Cu-145 mesh (copper wire mesh 402), and a 2 mil indium foil sheet (indium layer 304), the X-ray obscuration film 400 can be approximately 5 mils thick.

In some embodiments, copper wire mesh 302 and copper wire mesh 402 can comprise different sizes of copper wire mesh. In such embodiments, for example, copper wire mesh 302 can comprise Cu-200 mesh and copper wire mesh 402 can comprise Cu-145 or Cu-325 mesh. Using different sizes of copper wire mesh can, for example, when the X-ray obscuration film 400 is coupled to an electronic circuit/device subjected to radiographic inspection techniques, create a moiré-like interference pattern creating visual static that obscures the lines in the electronic circuit/device.

In various embodiments, additional copper wire mesh layers (not shown) can be included in X-ray obscuration film 400.

In some embodiments, the copper wire mesh 302, copper wire mesh 402, and indium layer 304 can be cold welded or solid-state bonded together, for example, as described in FIG. 5. FIG. 5 is a flowchart showing an exemplary method 500 for manufacturing an exemplary embodiment of an X-ray obscuration film. The method 500 begins at 502 and continues to 504.

At 504, one or more copper wire mesh layers and an indium layer can be overlaid in an orientation such that when the X-ray obscuration film is placed within an X-ray source and an X-ray detector, the copper wire mesh layers and indium layer create an interference pattern, such as a moiré-like interference pattern, creating visual static that can obscure circuit wiring lines when the X-ray obscuration film is coupled to or integral to an electronic circuit/device. For example, as described above, the one or more copper wire mesh layers can comprise two copper wire mesh layers of different sizes (e.g. Cu-200 and Cu-145) overlaid to create the interference pattern, an example of which is depicted in FIG. 2. The method continues to 506.

At 506, the one or more copper wire mesh layers and an indium layers can be placed in a vacuum press where they can be heated under high pressure to couple the layers together forming the X-ray obscuration film through solid-state bonding. The method continues to 508.

At 508, after the X-ray obscuration film cools, the X-ray obscuration film can be formed to a surface to which it is to be bonded, such as, for example, an electronic circuit. The X-ray obscuration film can deform and mold to a three-dimensional surface at room temperature by, for example, manually molding the X-ray obscuration film and/or press forming the X-ray obscuration film. In various embodiments, the X-ray obscuration film can be coupled to a surface, for example, an electronic circuit, using any suitable method including conventional adhesives. For example, vacuum bag cure adhesive can be used for conformance to complex surface contours. The method continues to 510, where the method ends.

It will be appreciated that the X-ray obscuration film can be coupled to any electronic device for which prevention of radiographic inspection is desired. For example, the electronic circuit can include, but is not limited to, an electronic device, a wiring circuit, a printed wiring board, an antenna pattern, or an electronic hybrid.

It will also be appreciated that in some embodiments the X-ray obscuration film is pliable enough to deform and be molded to a 3D or complex surface at room temperature by manually molding and/or press forming processes. In some embodiments, the formed X-ray obscuration film can retain its shape when de-molded and can be bonded in place using conventional adhesives, vacuum bag cure adhesive, or any other suitable method.

In one exemplary method, an X-ray obscuration film can be manufactured according to the following:

1. Cut equal sized pieces from the different film materials: 2 mil Indium Foil, Cu-200 Mesh, Cu-145 Mesh, and CuP-325 Mesh.

2. Stack the cut pieces (layers) on a smooth, flat metal platen in one of three configurations: Cu-325/Cu-145/2-In/CuP-200; Cu-200/2-In/Cu-145; or Cu-200/2-In/CuP-325.

3. Heat platens to 150 C in a vacuum press and press stack at 200 tons (~5000 psi) for 1.0 hour. Allow press to cool down before opening platens.

4. Layers are now solid-state bonded together and are all metallic forming the XRO (X-ray obscuration) film. XRO film is still pliable enough to manually conform to a 3D surface contour.

5. Form layered XRO film to surface to be bonded. Metallic film is able to deform and mold to a 3D surface at room temperature either by manually or press forming processes. Formed XRO film will retain its shape when de-molded.

6. Bond formed XRO film in place using any number of conventional adhesives. Vacuum bag cure adhesive for XRO film conformance to surface.

It will be appreciated that in various embodiments the one or more copper wire mesh layers and an indium layers can be coupled together using various methods, such as ultrasonic welding, resistance welding, explosion welding, friction welding (including friction stir welding), electromagnetic pulse welding, co-extrusion welding, cold welding, diffusion welding, exothermic welding, high frequency welding, hot pressure welding, induction welding, roll welding, and/or hammering.

Figure 6:
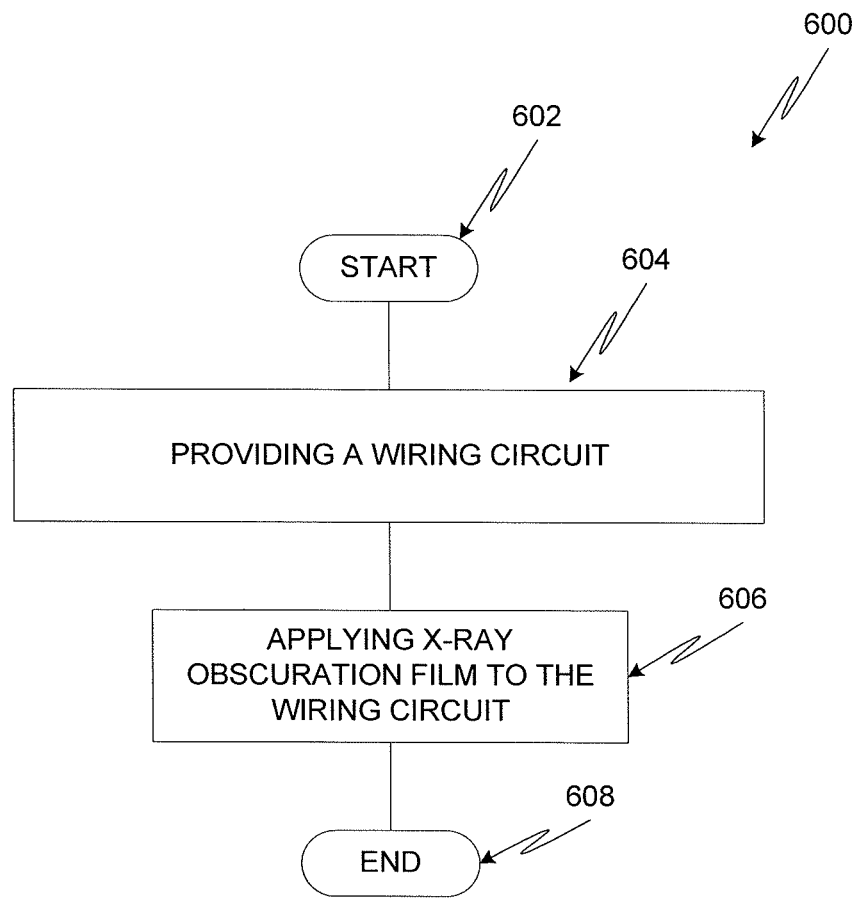
FIG. 6 is a flowchart showing an exemplary method for obscuring lines in an electronic circuit when subjected to radiographic inspection techniques.

FIG. 6 is a flowchart showing an exemplary method 600 for obscuring lines in an electronic circuit when subjected to radiographic inspection techniques. The method begins at 600 and continues to 602.

At 602, an electronic circuit is provided. The electronic circuit includes, for example, circuit lines to be obscured when subjected to radiographic inspection techniques. The method continues to 604.

At 604, an X-ray obscuration film is coupled to the surface of the electronic circuit. As described above, various embodiments of the X-ray obscuration film described herein provide obscuration of the circuit lines of the electronic circuit by creating an interference pattern which creates visual static obscuring the circuit lines when the electronic circuit is subjected to radiographic inspection techniques. As described above, in various embodiments, the X-ray obscuration film can be coupled to the electronic circuit, for example, using a vacuum bag cure adhesive or any other suitable method. The method continues to 606 where the method ends.

It will be appreciated that the electronic circuit can be any electronic device for which prevention of radiographic inspection is desired. For example, the electronic circuit can include, but is not limited to, an electronic device, a wiring circuit, a printed wiring board, an antenna pattern, or an electronic hybrid.

FIG. 7 is a cross-sectional view of an exemplary embodiment of an obscured electronic device 700 including an electronic circuit 706 with an X-ray obscuration film 702 coupled thereto. Obscured electronic device 700 can include an X-ray obscuration film 702 coupled to an electronic circuit 706 using an adhesive layer 704.

In some embodiments, X-ray obscuration film 702 can be coupled to electronic circuit 706 via adhesive layer 704 using a vacuum bag cure adhesive.

As discussed above, X-ray obscuration film 702 can provide for obscuration of the circuit lines when the obscured electronic device 700 is subjected to radiographic inspection techniques.

Optionally or additionally, in some embodiments, the X-ray obscuration film 702 can provide electromagnetic shielding and/or heat dissipation for electronic circuit 706.

In some embodiments, the X-ray obscuration film 702 can be retrofitted and/or coupled to existing electronic devices to, for example, obscure any circuit lines within the existing electronic devices when those devices are subjected to radiographic inspection techniques.

It will be appreciated that the electronic circuit 706 can be any electronic device for which prevention of radiographic inspection is desired. For example, the electronic circuit 706 can include, but is not limited to, an electronic device, a wiring circuit, a printed wiring board, an antenna pattern, or an electronic hybrid.

It will also be appreciated that the electronic circuit 706 can have complex surface contours and the X-ray obscuration film 702 can be molded or formed to such complex surface contours, as described hereinabove.

Figure 8:
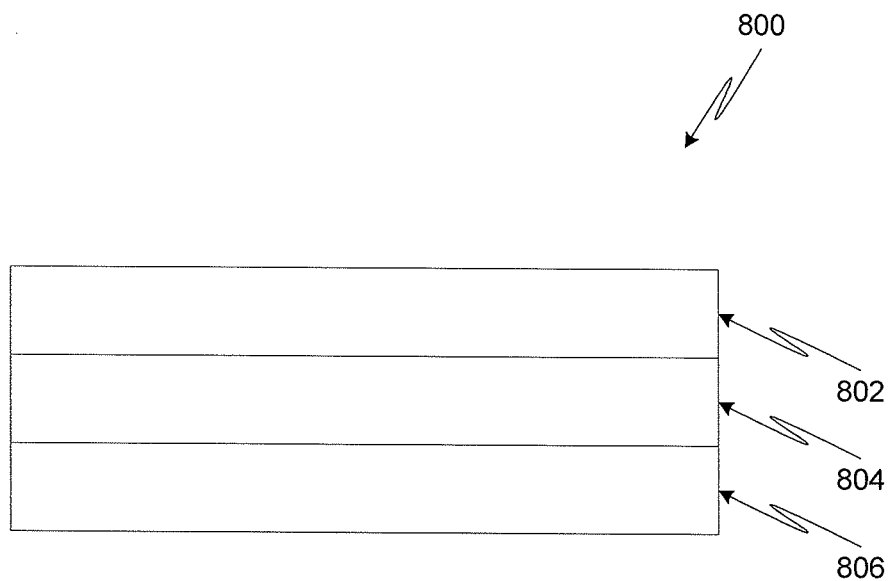
FIG. 8 is a cross-sectional view of an exemplary embodiment of an electronic circuit comprising an X-ray obscuration film layer integral to the electronic circuit.

FIG. 8 is a cross-sectional view of an exemplary embodiment of an electronic circuit 800 comprising an X-ray obscuration film layer 804 integral to the electronic circuit 800. The electronic circuit 800 can include a plurality of layers 802 and 806, and an X-ray obscuration film layer 804 integral to the plurality of layers 802 and 806.

In various embodiments, X-ray obscuration film layer 804 can be incorporated into the electronic circuit 800 during the manufacturing process of the electronic circuit 800.

As discussed above, X-ray obscuration film layer 804 can provide for obscuration of circuit lines of the electronic circuit 800 when the electronic circuit 800 is subjected to radiographic inspection techniques. Optionally or additionally, in some embodiments, the X-ray obscuration film layer 804 can provide electromagnetic shielding and/or heat dissipation for the electronic circuit 800.

In some embodiments, electronic circuit 800 can be a printed wiring board and X-ray obscuration film layer 804 can, for example, be included in the printed wiring board as a plane layer. X-ray obscuration film layer 100, 300, or 400 can be used as X-ray obscuration film layer 804.

It will be appreciated that the electronic circuit 800 can be any electronic device for which prevention of radiographic inspection is desired. For example, the electronic circuit 800 can include, but is not limited to, an electronic device, a wiring circuit, a printed wiring board, an antenna pattern, or an electronic hybrid.

Figure 9:
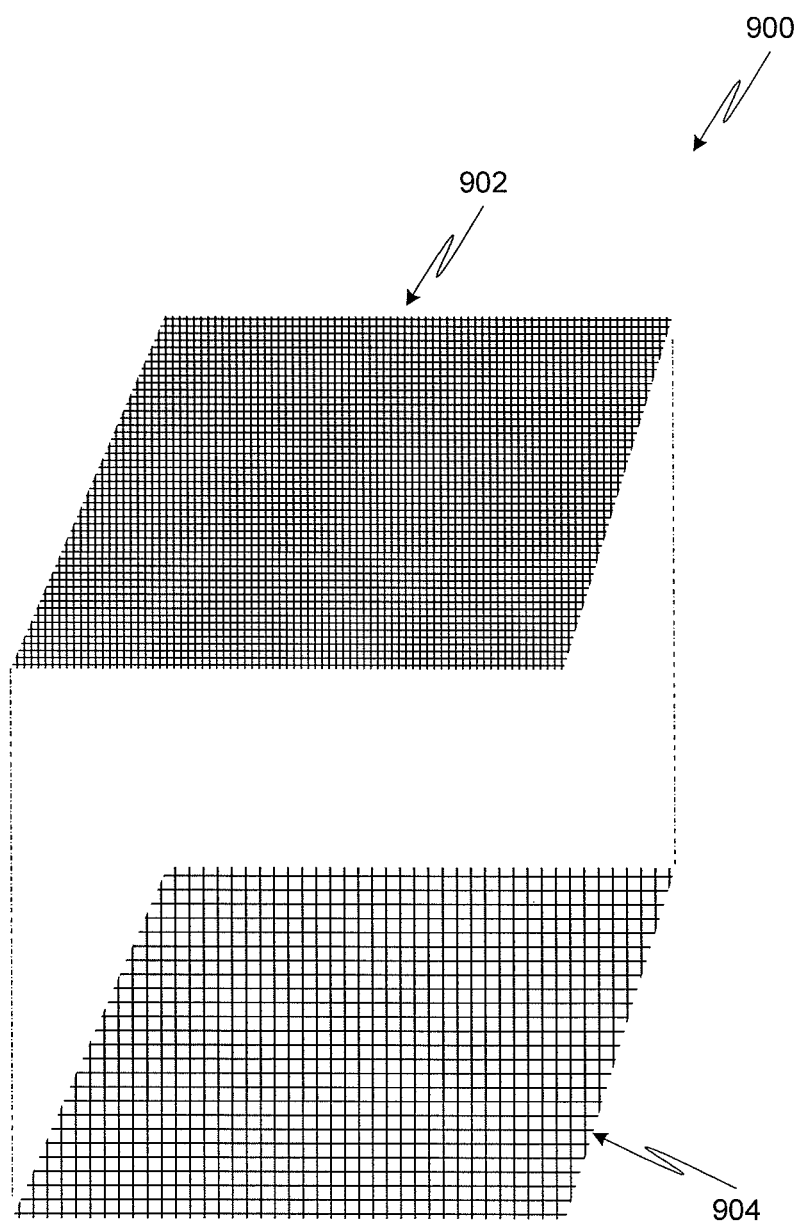
FIG. 9 is an exploded view of an X-ray obscuration film according to some embodiments of the disclosed subject matter.

FIG. 9 is an exploded view of an X-ray obscuration film 900 according to some embodiments of the disclosed subject matter. X-ray obscuration film 900 includes a first copper wire mesh layer 902 and a second copper wire mesh layer 904. The first and second copper wire mesh layers 902 and 904 can be bonded together, for example, by solid-state bonding as described in FIG. 5.

It will be appreciated that the first copper wire mesh layer 902 and second copper wire mesh layer 904 can be different sizes, such as, for example, Cu-200 Mesh, Cu-145 Mesh, or CuP-325 Mesh.

It will also be appreciated that the first copper wire mesh layer 902 and second copper wire mesh layer 904 can be configured such that X-ray obscuration film 900 absorbs at least a portion of electromagnetic radiation energy, such as, for example, X-ray energy, creating an interference pattern when placed between an electromagnetic radiation source and an electromagnetic radiation detector, and that when coupled to and/or integral to an electronic circuit as shown in FIGS. 7 and 8, respectively, the interference pattern obscures circuit lines in such an electronic circuit when subjected to radiographic inspection techniques. For example, the interference pattern can be a moiré interference pattern or moiré-like interference pattern, as shown in FIG. 2.

It will also be appreciated that the first and second copper wire mesh layers 902 and 904 can each be comprised of any metallic alloy wire mesh capable of absorbing at least a portion of electromagnetic radiation energy to create an interference pattern when coupled to an electronic device subjected to radiographic inspection techniques. For example, each layer 902 and 904 can each comprise a metallic alloy wire mesh of a different metallic alloy.

Figure 10:
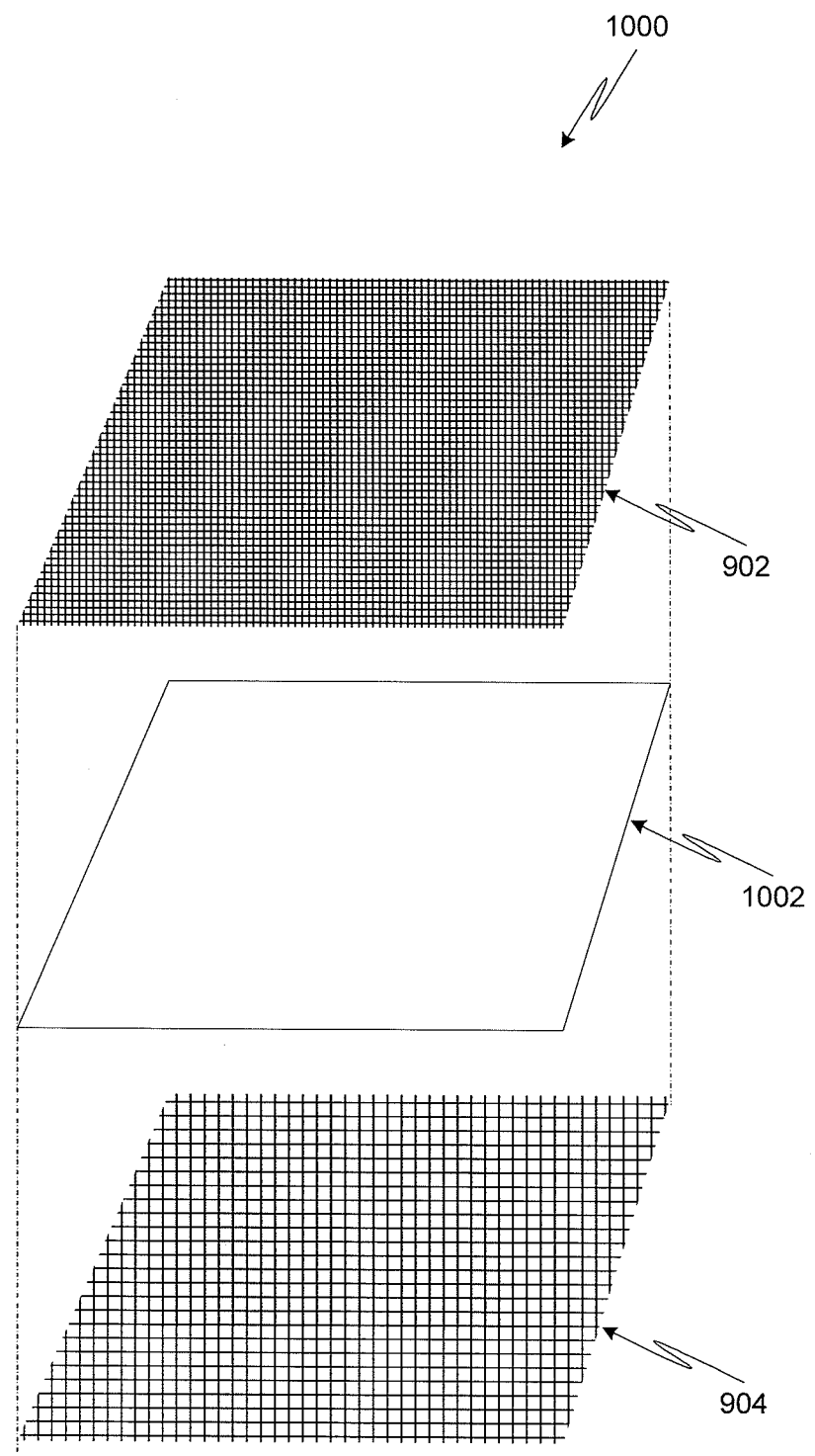
FIG. 10 is an exploded view of an X-ray obscuration film according to some embodiments of the disclosed subject matter.

FIG. 10 is an exploded view of an X-ray obscuration film 1000 according to some embodiments of the disclosed subject matter. X-ray obscuration film 1000 includes a first copper wire mesh layer 902, an indium layer 1002, and a second copper wire mesh layer 904. The first and second copper wire mesh layers 902 and 904 and the indium layer 1002 can be coupled together, for example, by solid-state bonding as described in FIG. 5.

It will be appreciated that, as described hereinabove, the first copper wire mesh layer 902 and second copper wire mesh layer 904 can be different sizes, such as, for example, Cu-200 Mesh, Cu-145 Mesh, or CuP-325 Mesh, and the indium layer 1002 can be a thin layer of indium, such as, for example, a 2 mil thick indium foil.

It will also be appreciated that the first copper wire mesh layer 902, indium layer 1002, and second copper wire mesh layer 904 can be configured such that X-ray obscuration film 900 absorbs at least a portion of electromagnetic radiation energy creating an interference pattern when placed between an electromagnetic radiation source and an electromagnetic radiation detector, and that when coupled to and/or integral to an electronic circuit as shown in FIGS. 7 and 8, respectively, the interference pattern obscures circuit lines in such an electronic circuit when subjected to radiographic inspection techniques. For example, the interference pattern can be a moiré interference pattern or moiré-like interference pattern, as shown in FIG. 2.

It will also be appreciated that the first and second copper wire mesh layers 902 and 904 and indium layer 1002 can each be comprised of any metallic alloy capable of absorbing at least a portion of electromagnetic radiation energy and configured to create an interference pattern when coupled to an electronic device subjected to radiographic inspection techniques.

While the invention(s) has/have been described in conjunction with a number of embodiments, it is evident that many alternatives, modifications and variations would be or are apparent to those of ordinary skill in the applicable arts. Accordingly, Applicant intends to embrace all such alternatives, modifications, equivalents, and variations that are within the spirit and scope of the invention(s) described herein. For example, while the preferred embodiment is discussed with reference to X-ray radiation, the invention may be used with visible light or other spectra of electro-magnetic radiation.

What is claimed is:

1. An obscured electronic device comprising:
   an electronic circuit including a plurality of circuit lines; and
   an obscuration film coupled to the electronic circuit, the obscuration film comprising
      a wire mesh, and
      an adjacent layer of material having portions which extend into openings of the wire mesh and in contact with portions thereof,
   wherein the obscuration film is configured to absorb at least a portion of electromagnetic radiation energy and to create an interference pattern obscuring the plurality of circuit lines of the electronic circuit when the device is placed between an electromagnetic radiation source and an electromagnetic radiation detector.

2. The device of claim 1, wherein the material comprises indium, and the wire mesh comprises copper.

3. The device of claim 1, wherein the obscuration film is less than 10 mils thick.

4. The device of claim 1, wherein the interference pattern is a moiré interference pattern.

5. An obscuration film comprising:
   a first metallic wire mesh; and
   a second metallic wire mesh,
   wherein the obscuration film is configured to absorb at least a portion of electromagnetic radiation energy and to create an optically created interference pattern when the obscuration film is placed between an electromagnetic radiation source and an electromagnetic radiation detector.

6. An obscuration film comprising:
   a first metallic wire mesh;
   a second metallic wire mesh;
   a third metallic wire mesh; and
   a layer of material having portions which extend into openings of at least one of the first metallic wire mesh, the second metallic wire mesh, or the third metallic wire mesh and in contact with metallic portions thereof,
   wherein the obscuration film is configured to absorb at least a portion of electromagnetic radiation energy and to create an interference pattern when the obscuration film is placed between an electromagnetic radiation source and an electromagnetic radiation detector.

7. The obscuration film of claim 6, wherein the first metallic wire mesh, the second metallic wire mesh, and the third metallic wire mesh each comprises a copper wire mesh.

8. An obscuration film comprising:
   a first metallic wire mesh; and
   a second metallic wire mesh,
   wherein the obscuration film is configured to absorb at least a portion of electromagnetic radiation energy and to create an interference pattern when the obscuration film is placed between an electromagnetic radiation source and an electromagnetic radiation detector,
   wherein the obscuration film is less than 10 mils thick.

9. An obscuration film comprising:
   a first metallic wire mesh; and
   a second metallic wire mesh,
   wherein the obscuration film is configured to absorb at least a portion of electromagnetic radiation energy and to create an interference pattern when the obscuration film is placed between an electromagnetic radiation source and an electromagnetic radiation detector,
   wherein the first wire mesh and the second wire mesh each comprise copper wire mesh.

10. The obscuration film of claim 8, wherein the obscuration film is no more than 5 mils thick.

11. The obscuration film of claim 5, wherein the interference pattern is a moiré interference pattern.

12. The obscuration film of claim 5, wherein the obscuration film is configured to be moldable to conform to an electronic device.

13. An obscuration film comprising:
    a first metallic wire mesh; and
    a second metallic wire mesh,
    wherein the obscuration film is configured to absorb at least a portion of electromagnetic radiation energy and to create an interference pattern when the obscuration film is placed between an electromagnetic radiation source and an electromagnetic radiation detector,
    wherein the first metallic wire mesh has a first mesh size and the second metallic wire mesh has a second mesh size, the first mesh size being different than the second mesh size.

14. A method of obscuring circuit lines in an electronic circuit, the method comprising:
provide an electronic circuit;
providing an obscuration film comprising a first metallic wire mesh and a second metallic wire mesh, wherein the obscuration film is configured to absorb at least a portion of electromagnetic radiation energy and to create an optically created interference pattern when the obscuration film is placed between an electromagnetic radiation source and an electromagnetic radiation detector; and
coupling the obscuration film to the electronic circuit.

15. A method of obscuring circuit lines in an electronic circuit, the method comprising:
providing an electronic circuit;
providing an obscuration film comprising a first metallic wire mesh and a second metallic wire mesh, wherein the obscuration film is configured to absorb at least a portion of electromagnetic radiation energy and to create an interference pattern when the obscuration film is placed between an electromagnetic radiation source and an electromagnetic radiation detector; and
coupling the obscuration film to the electronic circuit,
the obscuration film further comprising:
a third metallic wire mesh; and
a layer of material having portions which extend into openings of at least one of the first metallic wire mesh, the second metallic wire mesh, or the third metallic wire mesh and in contact with metallic portions thereof.

16. A method of obscuring circuit lines in an electronic circuit, the method comprising:
providing an electronic circuit;
providing an obscuration film comprising a first metallic wire mesh and a second metallic wire mesh, wherein the obscuration film is configured to absorb at least a portion of electromagnetic radiation energy and to create an interference pattern when the obscuration film is placed between an electromagnetic radiation source and an electromagnetic radiation detector; and
coupling the obscuration film to the electronic circuit,
wherein the obscuration film is less than 10 mils thick.

17. A method of obscuring circuit lines in an electronic circuit, the method comprising:
providing an electronic circuit;
providing an obscuration film comprising a first metallic wire mesh and a second metallic wire mesh, wherein the obscuration film is configured to absorb at least a portion of electromagnetic radiation energy and to create an interference pattern when the obscuration film is placed between an electromagnetic radiation source and an electromagnetic radiation detector; and
coupling the obscuration film to the electronic circuit,
wherein the first wire mesh and the second wire mesh each comprise copper wire mesh.

18. The method of claim 16, wherein the obscuration film is no more than 5 mils thick.

19. The method of claim 14, wherein the interference pattern is a moiré interference pattern.

20. A method of obscuring circuit lines in an electronic circuit, the method comprising:
providing an electronic circuit;
providing an obscuration film comprising a first metallic wire mesh and a second metallic wire mesh, wherein the obscuration film is configured to absorb at least a portion of electromagnetic radiation energy and to create an interference pattern when the obscuration film is placed between an electromagnetic radiation source and an electromagnetic radiation detector; and
coupling the obscuration film to the electronic circuit,
wherein the obscuration film is configured to be moldable to conform to the electronic circuit.

\* \* \* \* \*